United States Patent
Omae et al.

(10) Patent No.: US 8,808,976 B2
(45) Date of Patent: Aug. 19, 2014

(54) PHOTORESIST DEVELOPER AND METHOD FOR FABRICATING SUBSTRATE BY USING THE DEVELOPER THEREOF

(75) Inventors: Shunkichi Omae, Yamaguchi (JP); Seiji Tono, Yamaguchi (JP); Toshiaki Otani, Yamaguchi (JP); Yasutaka Natsuka, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 1191 days.

(21) Appl. No.: 11/917,175

(22) PCT Filed: Jun. 13, 2006

(86) PCT No.: PCT/JP2006/311814
§ 371 (c)(1),
(2), (4) Date: Mar. 17, 2008

(87) PCT Pub. No.: WO2006/134902
PCT Pub. Date: Dec. 21, 2006

(65) Prior Publication Data
US 2009/0130606 A1 May 21, 2009

(30) Foreign Application Priority Data

Jun. 13, 2005 (JP) .................. 2005-172952
Jun. 29, 2005 (JP) .................. 2005-189438

(51) Int. Cl.
*G03C 5/18* (2006.01)
*G03C 5/26* (2006.01)
*G03F 7/00* (2006.01)
*G03F 7/32* (2006.01)

(52) U.S. Cl.
CPC ..................... *G03F 7/322* (2013.01)
USPC ........... 430/434; 430/309; 430/331; 430/406

(58) Field of Classification Search
CPC ....................................... G03F 7/322
USPC .................... 430/435, 331, 334, 434
See application file for complete search history.

(56) References Cited

U.S. PATENT DOCUMENTS

| 4,628,023 | A | * | 12/1986 | Cawston et al. | ............. | 430/331 |
| 5,756,267 | A | * | 5/1998 | Matsuda et al. | ............. | 430/331 |
| 6,455,234 | B1 | | 9/2002 | Lassila et al. | | |
| 2003/0104322 | A1 | * | 6/2003 | Yamashita et al. | ............. | 430/331 |
| 2006/0194154 | A1 | * | 8/2006 | Chen et al. | ................ | 430/331 |

FOREIGN PATENT DOCUMENTS

| JP | 05-333562 | | 12/1993 | | |
| JP | 06-003549 | | 1/1994 | | |
| JP | 07-120935 | A | 5/1995 | | |
| JP | 2589408 | | 12/1996 | | |
| JP | 2002-169299 | | 6/2002 | | |
| JP | 2003-107742 | | 4/2003 | | |
| JP | 2003-131396 | | 5/2003 | | |
| JP | 2003131396 | A | * 5/2003 | .............. | G03F 7/32 |
| JP | 2003-167329 | | 6/2003 | | |
| JP | 2004-133433 | | 4/2004 | | |
| JP | 2004-354402 | | 12/2004 | | |
| JP | 2005-134800 | | 5/2005 | | |
| WO | WO 2006059747 | A1 | * 6/2006 | | |

* cited by examiner

*Primary Examiner* — Chanceity Robinson
(74) *Attorney, Agent, or Firm* — Ladas & Parry LLP (57) ABSTRACT

A photoresist developer including a basic aqueous solution containing 0.5~10 mass % of a particular nonionic surfactant and 0.01-10 mass % of particular ammonium compound, the photoresist developer makes it possible to form a favorable resist pattern with out causing scum even when developing thick photoresists.

10 Claims, 2 Drawing Sheets

PHOTORESIST DEVELOPER AND METHOD FOR FABRICATING SUBSTRATE BY USING THE DEVELOPER THEREOF

TECHNICAL FIELD

The present invention relates to a photoresist developer to be used for fabricating semiconductor device, flat-panel display (FPD), circuit substrate, and magnetic head. More specifically, the present invention relates to a photoresist developer particularly suitably used for thick photoresist preferably used for forming magnetic pole of a magnetic head or projection electrode (the so-called "bump") used as connecting terminals of large-scale integration (LSI). The present invention also relates to a method for fabricating a substrate on which patterns are formed by using the above photoresist developer.

BACKGROUND ART

In the wide range of area including fabrication of semiconductor IC such as LSI and display surface of FPD, and fabrication of circuit substrate such as magnetic head, importance of high-precision processing technology is increasing. Photo fabrication being mainstream of the high-precision processing technology for forming minute device or minute working means an art for fabricating various precision components like semiconductor packages by coating photosensitive resin composition called as "photoresist" (hereinafter, it may be abbreviated as "resist".) on the surface to be worked to form a coating, patterning the coating by developer, and forming a pattern with the above patterned coating as a mask by carrying out the electroforming (specifically, chemical etching, electrolytic etching, electroplating, or combinations thereof).

In recent years, with a downsizing of electronic devices, high-density mounting technology of semiconductor packages has been developed. In order to mount the packages on the electronic devices like LSI, multiple-pin thin-film mounting method is carried out for providing connecting terminals consisting of projection electrodes onto the surface of the support such as substrate. In the multiple-pin thin-film mounting method, connecting terminals consisting of bumps which projects from the support, or another connecting terminals consisting of posts called as "metal post" which projects from the support, and solder ball formed thereon are used.

The bumps and the metal posts are, in general, made in accordance with the following procedures. Namely, first of all, an around 3 μm or more thick of thick photoresist layer is formed on a substrate as the support; through the steps of exposure and development, resist pattern of which width is usually 5 μm or more is formed; then, on the surface of the substrate exposed from the pattern's concave portion (a section which is not covered by the resist, it may be called as "non-resist section"), a conductor such as copper is filled by plating or the like; and finally, the resist pattern around the conductor is removed, to form the bumps and the metal posts (refer to Patent document 1).

In the above-described method, the 3 μm or more thick of exposed thick photoresist layer is needed to be developed. However, when film thickness of the resist becomes thicker, scum tends to be caused; thereby shape of resist pattern tends to be deteriorated.

So as to inhibit cause of the scum and to form favorable resist pattern, a method by adding surfactants to the developer is known (refer to Patent documents 2~4). For example, Patent document 2 discloses a method as follows: by using a developer consisting of tetramethyl hydroxide aqueous solution to which 0.01~0.5 weight % of aqueous nonionic surfactant and 0.004~0.4 weight % of a particular cationic surfactant are added, 1.5 μm thick of positive-type photoresist film is developed, to obtain a high contrast resist profile. Moreover, Patent document 3 discloses a photoresist developer consisting of alkaline aqueous solution containing nonionic surfactant and cationic surfactant at the concentration of 10~5000 weight ppm in total. Further, Patent document 4 discloses a method which is capable to form a favorable pattern without causing scum and film's residue as follows: 1.3 μm thick of the resist film is developed by using developer consisting of an aqueous solution of an organic quaternary ammonium compound containing 500~50,000 ppm of anionic surfactant having a particular structure.

Patent Document 1: Japanese Patent Application Laid-Open (JP-A) No. 2005-134800
Patent Document 2: Japanese Patent Application Examined No. 6-3549
Patent Document 3: JP-A No. 2002-169299
Patent Document 4: Japanese Patent No. 2589408

DISCLOSURE OF THE INVENTION

Problems to be Solved by the Invention

Nevertheless, when the developer disclosed in the above Patent documents 2~4 for the development of the above-described thick photoresist, generation of scum can not be sufficiently inhibited. Accordingly, an object of the present invention is to provide a developer which is capable to obtain a favorable pattern without causing scum even when developing 3 μm or more thick of thick photoresist.

Means for Solving the Problems

The present inventors have been carried out serious studies and completed the following invention.

The first aspect of the present invention is a photoresist developer comprising a basic aqueous solution containing a nonionic surfactant and an ammonium compound, wherein the nonionic surfactant has one or more kinds of alkyleneoxide group repeating structure in which 11~70 units of the alkyleneoxide group are included and content of the nonionic surfactant is 0.5~10 mass % to total mass of the photoresist developer as 100 mass %, the ammonium compound is represented by a following general formula (1):

(1)

[In the formula (1), $R^1$ is an organic group of carbon number 4~40; each of $R^2$, $R^3$, and $R^4$ is independently an organic group of carbon number 1~20, or two or three thereof are bonded each other to form a heterocycle of carbon number 4~20; and X is OH, Cl, Br, or I.] and content of the ammonium compound is 0.01~5.0 mass % to total mass of the photoresist developer as 100 mass %.

In the first aspect of the invention, the nonionic surfactant is preferably the one represented by a following general formula (2):

(2)

[In the formula (2), a is an integer 1 or 2; b is an integer 11~70 when a is 1, or b is an integer such that total of (YO) contained in two {(YO)$_b$—R$^6$} is 11~70 when a is 2; each of R$^5$ and R$^6$ is a hydrogen atom or an organic group of carbon number 1~40; Z is an (a+1) valent heteroatom; and Y is an alkylene group of carbon number 2~4, in one molecule, all (YO) may be the same, or (YO) may be a combination of two or more kinds of different (YO). Further, when a is 2, two {(YO)$_b$—R$^6$} are the same or different from each other.]. By having such nonionic surfactants included, it is capable to more effectively inhibit the occurrence of scum.

In the first aspect of the invention, R$^1$ in the general formula (1) representing the ammonium compound is preferably a hydrocarbon group represented by —CH$_2$—Ar

[Ar is an aromatic hydrocarbon group of carbon number 6~10.]. By containing the ammonium compound like this, it is capable to effectively inhibit the deterioration of the resist pattern portion.

In the first aspect of the invention, R$^5$ in the general formula (2) representing the nonionic surfactant is preferably a hydrocarbon group containing at least two benzene rings. By containing the nonionic surfactant like this, it is capable to effectively inhibit the generation of scum.

The photoresist developer of the first aspect of the present invention is suitably used for developing a 3 μm~100 μm thick exposed photoresist layer. Conventionally, when developing such a thick photoresist, scum occurs, thereby it is difficult to obtain a preferable resist pattern. On the other hand, with the present invention, it is capable to obtain a preferable resist pattern by inhibiting the generation of scum even when developing thick photoresist.

The second aspect of the present invention is a method of photoresist development for developing the 3 μm~100 μm thick exposed photoresist layer by use of the photoresist developer of the first aspect of the invention.

The third aspect of the present invention is a method for fabricating a substrate on which pattern is formed by photolithographic method, the method for fabricating a substrate comprising: a resist application step for applying photoresist on the surface of a substrate; an exposure step for exposing the photoresist applied in the resist application step to radiation through a photo mask having a certain pattern; a photoresist development step for forming a resist pattern corresponding to the pattern of the photo mask by removing the exposed area or the non-exposed area of the photoresist layer exposed in the exposure step; and a finishing step for giving etching or plating in an area, where is not covered by the resist pattern, of the substrate on which surface has the obtained resist pattern by the photoresist development step, wherein a 3 μm~100 μm thick photoresist layer is formed on the surface of the substrate in the resist application step, and the exposed area or the non-exposed area of the photoresist layer is removed by use of the photoresist developer of the first aspect of the invention in the photoresist development step. When the developer of the first aspect of the invention is used, it is possible to develop a thick photoresist easily with a high degree of accuracy. In the third aspect of the invention, by adopting this developer, for example, connecting terminals such as bumps can be easily formed on a substrate with a high degree of accuracy.

In the third aspect of the invention, multistep removal of the exposed area or the non-exposed area of the photoresist layer by use of the photoresist developer of the first aspect of the invention can also be carried out. In other words, in the photoresist development step, by having two or more repeated operations in which the exposed area or the non-exposed area of the exposed photoresist layer is contacted to the developer and either of these areas is optionally washed, either the exposed area or the non-exposed area of the photoresist layer can be removed. In the development step, if puddling method or spraying method is adopted, multistep removal can inhibit generation of scum and resist film residue. Thus it is capable to effectively inhibit deterioration of the resist pattern shape.

The fourth aspect of the present invention is a photoresist developer comprising a basic aqueous solution containing a nonionic surfactant and two or more kinds of ammonium cations, wherein the photoresist developer is obtained by dissolving in water the nonionic surfactant having one or more kinds of alkyleneoxide group repeating structure, in which 11~70 units of the alkyleneoxide group are included, at the amount of 0.5~10 mass % to total mass of the photoresist developer as 100 mass %; one of the ammonium compounds represented by a following general formula (1):

(1)

[In the formula (1), R$^1$ is an organic group of carbon number 4~40; each of R$^2$, R$^3$, and R$^4$ is independently an organic group of carbon number 1~20, or two or three thereof are bonded each other to form a heterocycle of carbon number 4~20; and X is OH, Cl, Br, or I.]
at the amount of 0.01~5.0 mass % to total mass of the photoresist developer as 100 mass %; and another ammonium compound represented by a following general formula (3):

(3)

[In the formula (3), each of R$^{11}$, R$^{12}$, R$^{13}$, and R$^{14}$ is independently a hydrogen atom or an organic group of carbon number 1~3.]
at the amount of 0.1~10 mass % to total mass of the photoresist developer as 100 mass %.

Effects of the Invention

In a circumstance where a resist pattern is formed on a substrate with adopting the thick photoresist, by using the developer of the present invention, it is capable to develop the photoresist with inhibiting generation of scum and minimizing deterioration of the resist pattern shape.

BRIEF DESCRIPTION OF THE DRAWINGS

FIGS. 1(*a*) and 1(*b*) are photographs respectively showing a substrate treated by the developer of Example 11; and FIGS. 2(*a*) and 2(*b*) are photographs respectively showing a substrate treated by the developer of Comparative example 6.

| Description of the reference numerals | |
|---|---|
| 10 | resist dissolution part |
| 20 | resist pattern portion |

BEST MODE FOR CARRYING OUT THE INVENTION

<Photoresist Developer>

The photoresist developer of the present invention consists of a basic aqueous solution containing 0.5~10 mass % of nonionic surfactant and 0.01~5.0 mass % of the predetermined ammonium compound, to total mass of the photoresist developer (100 mass %). As shown in the above Patent documents 2 and 3, a photoresist developer obtained by adding a nonionic surfactant and a cationic surfactant (corresponding to the ammonium compound of the photoresist developer of the present invention) to the developer consisting of the basic aqueous solution is publicly known. The quantity of these surfactants to be added to the conventional developer is extremely small. Development of a thick photoresist by using such a developer cannot effectively inhibit generation of scum, thereby it is difficult to obtain a favorable resist pattern. On the other hand, the developer of the present invention contains significantly large quantity of the surfactant, particularly nonionic surfactant compared with the conventional developers. Thus, it is capable to easily form a favorable resist pattern when developing a thick photoresist.

Although the mechanism of the obtained excellent effect is uncertain at this time, the inventors assume it as follows. That is, in a circumstance to use puddling development method being suitably used as a general development method, usage of the developer for one development step is constant irrespective of resist thickness. Compare to the usual photolithography process using thin resist film, when a thick photoresist of which thickness is 3 μm or more is developed, concentration of the dissolved resist component in the developer becomes higher, thereby dissolving capacity of the resist component is assumed to be weaken. While, in the developer of the present invention, by raising the concentration of the nonionic surfactant to a significantly high concentration, reduction of the dissolving capacity seems to become possible and to inhibit generation of scum. In addition, one of the reasons for deterioration of resist pattern shape is dissolution of a part of the portion to be necessary remained as the pattern after development (it may be called as "resist pattern portion".) into the developer, and this tendency may raise the concentration of the nonionic surfactant. Whereas, in the developer of the present invention, by containing predetermined amount of a certain ammonium compound, the dissolution of resist pattern portion can be inhibited without remarkably lowering the developing rate. Thus, no pattern deformation can be found.

(Basic Aqueous Solution)

As a basic aqueous solution to be used for the developer of the invention, any basic aqueous solutions publicly known as a component of the conventional developer of photoresist can be used without limitation. Examples thereof may include: aqueous solution of primary amines, secondary amines, and tertiary amines of propyl amine, butyl amine, dibutyl amine, triethyl amine, and so on; aqueous solution of basic heterocycle compounds of pyrrole, pyrrolidine, pyrolidone, pyridine, morpholine, pyrazine, piperidine, oxazole, thiazole, and so on; aqueous solution of quaternary ammonium compounds of tetramethylammonium hydroxide (hereinafter, it is abbreviated as "TMAH"), tetraethylammonium hydroxide, tetrapropylammonium hydroxide, trimethylethylammonium hydroxide, trimethyl (2-hydroxyethyl) ammonium hydroxide, triethyl (2-hydroxyethyl) ammonium hydroxide, tripropyl (2-hydroxyethyl) ammonium hydroxide, trimethyl (1-hydroxypropyl) ammonium hydroxide, and so on.

These basic aqueous solutions may be an aqueous solution of single basic compound, or an aqueous solution of a combination of plural different kinds of basic compounds. In view of strong base, it is preferably quarternary ammonium compound. Also, as the dissolving capacity for the resist component caused by exposure to the developer and cleaning solution (rinse agent) is excellent, smaller molecular weight is preferable. Further, it is preferable if the basic aqueous solutions have high water-soluble substituents.

Accordingly, the basic aqueous solutions may be ammonium compounds represented by the following formula (3):

[In the formula (3), each of $R^{11}$, $R^{12}$, $R^{13}$, and $R^{14}$ is independently an organic group of carbon number 1~3.].

In the above formula (3), each of $R^{11}$, $R^{12}$, $R^{13}$, and $R^{14}$ is an organic group of carbon number 1~3, preferably an organic group of carbon number 1 or 2; the organic group may have a hydrophilic substituent such as hydroxyl group. Moreover, the carbon number of the organic group represented by $R^{11}$~$R^{14}$ is preferably 4~6 in total.

Specific examples of the organic group include methyl group, ethyl group, propyl group, 2-hydroxylethyl group, and the like.

Among the basic compounds represented by the above formula (3), using a basic aqueous solution consisting of aqueous solution of TMAH and/or trimethyl (2-hydroxyethyl) ammonium hydroxide is suitable.

The concentration of basic compound in the above basic aqueous solution cannot be specified as optimal concentration, because it is varied depending on the kinds of basic compound to be used. It is generally in the range of 0.1~10 mass %, preferably 1~5 mass %. When concentration of the basic compound is less than 0.1 mass %, dissolution of the part which has to be removed by development (it may be called as "resist dissolution part".) into the developer becomes less, thereby pattern forming tends to be difficult. While, when concentration of the basic compound is over 10 mass %, resolvability of the resist pattern portion becomes higher, therefore patterning with a high degree of accuracy tends to be difficult.

The significant feature of the photoresist developer of the invention is to contain 0.5~10 mass % of the nonionic surfactant and 0.01~5.0 mass % of the certain ammonium compound in the above basic aqueous solution, to total mass of the photoresist developer (100 mass %). Adding the nonionic surfactant in high concentration is highly effective for inhibiting scum, however, it also has a side-effect to increase the resolvability of the resist pattern part into the developer. Hence, the obtained pattern tends to be easily deteriorated. In the invention, by using the predetermined amount of the certain ammonium compound at the same time, resolvability of the resist pattern part into the developer is inhibited. Accordingly, in the development of 3 μm~100 μm thick photoresist, preferably 5 μm~100 μm thick photoresist, most preferably 10 μm~100 μm thick photoresist, it becomes possible to inhibit generation of scum and deterioration of resist pattern shape. When concentration of the nonionic surfactant is 0.5 mass % or less, inhibiting effect to the generation of scum is small; whereas, when the concentration is 10 mass % or more, deterioration of the resist pattern shape becomes large. While, when concentration of the cationic surfactant to be added is 0.01 mass % or less, inhibiting effect of the deterioration of the resist pattern shape is small; if the concentration is 5.0 mass % or more, development rate becomes slower, which is not practical. In view of effects of each component, additive quantity of the nonionic surfactant to the basic aqueous solution is more preferably 1~7 mass %. Further, additive quantity of the cationic surfactant is more preferably 0.03~1.0 mass %.

(Nonionic Surfactant)

The nonionic surfactant being contained in the photoresist developer of the invention has a repeating structure of one or more kinds of alkyleneoxide group, and the repeating structure has 11~70 units of the alkyleneoxide group.

Examples of these nonionic surfactans include compounds having 11~70 units of alkyleneoxide group of polyoxyethylene alkylether, polyoxyethylene polyoxypropylene alkylether, polyoxyethylene alkylphenylether, polyoxyalkylene polycyclic phenylether, polyoxyethylene polyoxypropylene polyoxyethylene alkylether, polyoxypropylene polyoxyethylene polyoxypropylene alkylether, polyoxyethylene polyoxypropylene alkylphenylether, polyoxyethylene glycol, polyoxyethylene polyoxypropylene glycol, polyoxypropylene glycol, polyoxyethylene polyoxypropylene polyoxyethylene glycol, polyoxyethylene fatty acid ester, polyoxyethylene sorbitan fatty acid ester, polyoxyethylene alkylamide, polyoxyethylene polyoxypropylene alkylamide, polyoxyethylene alkylaminoether, polyoxyethylene polyoxypropylene alkylaminoether, polyoxyethylene acethyleneglycol, polyoxyethylene polyoxypropylene acethyleneglycol. These surfactants may be used in combination of two or more thereof.

Among these nonionic surfactants, suitably used one is represented by the following general formula (2).

$$R^5-Z-\{(YO)_b-R^6\}_a \quad (2)$$

In the formula (2), a is an integer 1 or 2; b is an integer 11~70 when a is 1, or b is an integer such that total of (YO) contained in two $\{(YO)_b-R^6\}$ is 11~70 when a is 2.

When the alkyleneoxide group represented by (YO) is 10 or less, generation of scum cannot be sufficiently inhibited. On the other hand, if (YO) is too large, removing property of the scum tends to decrease.

In the formula (2), each of $R^5$ and $R^6$ is a hydrogen atom or an organic group of carbon number 1~40. $R^5$ is preferably a hydrogen atom or an organic group of carbon number 6~29. Specific examples of $R^5$ include straight-chain or branching-chain of a hydrocarbon group of carbon number 6~13 such as hexyl group, heptyl group, octyl group, nonyl group, decyl group, undecyl group, dodecyl group, tridecyl group; a hydrocarbon group or a hydrocarbon group substituted by an alkoxy group both represented by the following formula (4), each of which has a benzene ring and of which carbon number is 6~20:

(4)

[In the formula (4), $R^7$ is straight-chain or branching-chain of an alkyl group of carbon number 1~10 such as hydrogen atom, methyl group, ethyl group, propyl group, butyl group, pentyl group, hexyl group, and heptyl group, or an alkoxy group of carbon number 1~10 such as methoxy group, ethoxy group, propoxy group, and butoxy group. Among them, it is preferably an alkyl group, more preferably an alkyl group of carbon number 1~5];

an organic group of carbon number 10~15 having a carbonyl group represented by the following formula (5):

(5)

[In the formula (5), $R^8$ is straight-chain or branching-chain of an alkyl group of carbon number 5~20 such as nonyl group, decyl group, undecyl group, dodecyl group, tridecyl group, tetradecyl group. Among them, it is preferably an alkyl group of carbon number 10~15];

a hydrocarbon group, of which carbon number is 14~29 and which has at least two benzene rings, represented by the following formula (6):

(6)

[In the formula (6), $R^9$ is a hydrogen atom or a methyl group, $R^{10}$ is an alkylene group of carbon number 1~3 such as methylene group, ethylene group, or trimethylene group; p is an integer 1~3, it is preferably 2 or 3.].

As $R^6$ in the formula (2), there may be the same group as that of $R^5$. Among them, it is preferably a hydrogen atom or a hydrocarbon group of carbon number 1~6, a hydrogen atom is particularly preferable.

In the formula (2), Z is an (a+1) valent heteroatom, examples of this may be oxygen atom, nitrogen atom, and phosphorus atom. Among them, oxygen atom or nitrogen atom is preferable. Y is an alkylene group of carbon number 2~4, it is preferably ethylene group or propylene group. In one molecule, all (YO) may be the same, or (YO) may be a combination of two or more kinds of different (YO).

The group represented by $(YO)_b$ includes:

In the above examples, l and m are respectively an integer 3~40, n is an integer 1~30. When a is 1, (l+m+n) is preferably an integer 11~70; when a is 2, (l+m+n) is preferably an integer 6~35.

Moreover, when a is 2, two $\{(YO)_b-R^6\}$ are the same each other or different from each other. Because of this, repeating unit of the alkyleneoxide group in the two $\{(YO)_b-R^6\}$ may be different. In such a case, total number of (YO) contained in both of $\{(YO)_b-R^6\}$ may be in the range of 11~70. Accordingly, number of (YO) contained in one of two $\{(YO)_b-R^6\}$ may be 10 or less.

(Ammonium Compound)

The ammonium compound contained in the photoresist developer of the invention is an ammonium compound represented by the following general formula (1).

(1)

In the formula (1), $R^1$ is an organic group of carbon number 4~40, preferably an organic group of carbon number 6 or more. The organic group may contain one or more kinds of bond selected from a group consisting of ether bond, ester bond, and amide bond. Further, $R^1$ may be an alkyl group having a repeating structure of straight-chain or branching-chain of an alkyl group or an alkyleneoxide group. As the $R^1$, there may be a group represented by the formula (7):

(7)

[In the formula (7), Ar is an aromatic hydrocarbon group of carbon number 6~10 such as phenyl group, toluyl group, and xylyl group. It is preferably an aromatic hydrocarbon group of carbon number 6~8, particularly phenyl group.].

In the formula (1), each of $R^2$, $R^3$, and $R^4$ is independently an organic group of carbon number of 1~20, or two or three thereof are bonded each other to form a heterocycle of carbon number 4~20. The heterocycle is preferably a five-membered ring or a six-membered ring; these rings may further have substituent groups. Each of $R^2$, $R^3$, and $R^4$ is preferably an organic group of carbon number of 1~20, more preferably an organic group of carbon number 1~5. In addition, with including carbon atoms contained in the above $R^1$, total carbon number contained in the ammonium compound represented by the above formula (1) is preferably 10 or more. The organic group of carbon number 1~20 may have one or more kinds of bond other than C—C bond such as ester bond, ether bond, and hydroxy group. Specific examples of the organic group of carbon number 1~20 include: methyl group, ethyl group, propyl group, butyl group, 2-acetoxyethyl group, and 2-hydroxyethyl group. Also, specific examples of the heterocycle of carbon number 4~20 include the one constituting of a pyridinium group.

X in the formula (1) is OH, Cl, Br, or I.

The above basic compound and the ammonium compound represented by the formula (1) both get dissociated into cation and anion in water, and ion-exchange can be easily done. Accordingly, as the ammonium compound represented by the formula (1), when an ammonium compound of which X is OH is used, instead of the basic compound, matching chloride, bromide, or iodide may be blended up to the equimolar to the blending quantity of the ammonium compound Examples of the ammonium compound represented by the general formula (1) include: hydroxide, chloride, bromide, iodide of ammonium such as tetrabutyl ammonium, tetraoctyl ammonium, butyl trimethylammonium, hexyl trimethylammonium, octyl trimethylammonium, dodecyl trimethylammonium, hexyl triethylammonium, dibutyl dimethylammonium, dibutyl diethylammonium, dihexyl dimethylammonium, diethyl dihexylammonium, diethyl diheptylammonium, dodecyl 2-hydroxyethyl dimethylammonium, benzil trimethylammonium, benzil triethylammonium, benzil trihexylammonium, benzil tripentylammonium, benzil methyl diethylammonium, benzil tri(2-acetoxyethyl) ammonium, benzil hexyl dimethylammonium, benzil hexyl diethylammonium, benzil hexyl methylethylammonium, benzil heptyldimethylammonium, benzil heptyldiethylammonium, benzil heptylmethylethylammonium, benzil octyldimethylammonium, benzil octyldiethylammonium, benzil octylmethylethylammonium, benzil nonyldimethylammonium, benzil nonyldiethylammonium, benzil nonyl methylethylammonium, benzil decyldimethylammonium, benzil decyl diethylammonium, benzil decyl methylethylammonium, N-nonyl imidazolinium, N-decal imidazolinium, N-undecyl imidazolinium, N-dodecyl imidazolinium, N-nonyl pyridinium, N-decyl pyridinium, N-undecyl pyridinium, N-dodecyl pyridinium, N-benzil pyridinium, polyoxyethylene dimethyl benzil ammonium, polyoxyethylene diethyl benzil ammonium, polyoxyethylene dipropyl benzil ammonium, polyoxyethylene dibutyl benzil ammonium, polyoxyethylene dipentyl benzil ammonium, and so on. These ammonium compounds may be used in combination of two or more thereof.

(Additive Agent)

In the developer of the present invention, publicly known additive agents used for conventional developers can be adequately used to the degree which does not damage its nature of the invention. Examples of such an additive agent include other surfactants, moisturizer, stabilizer, and dissolution aid. These may be added alone or in combination of two or more kinds thereof.

<Development Method>

When an exposed photoresist layer is developed by using the developer of the present invention, as a method for photoresist development, any kinds of publicly know methods like dip method, puddling development method, and spraying development method can be used without limitation. The dip method is a development method having the procedures of dipping in the developer a substrate (e.g. silicon wafer) on which a photoresist layer is formed for a predetermined period of time, thereafter, dipping it in pure-water, and then drying. Puddling development method is a method having the procedures of dropping the developer on the surface of photoresist, leaving it statically for a predetermined period of time, thereafter, washing it by pure-water and drying it. Further, spraying development method is a method having the procedures of spraying the developer on the surface of photoresist, thereafter, washing it by pure-water and drying it.

When development of a thick photoresist is carried out by use of the developer of the present invention, if the above puddling development method or spraying development method is adopted, it is suitable to carry out multistep development: in other words, after treated by a step of development by use of the predetermined quantity of developer, the developer is removed, then the treated photoresist is developed again by use of another predetermined quantity of fresh developer (the development can be repeated, if necessary). When the developer is removed, cleaning solution (rinse agent) such as ultrapure water may be used depending on the condition. By using the cleaning solution, generation of scum, residue of the resist film, and deterioration of the pattern shape are inhibited. The repeating number may be set depending on thickness of the resist to be used, it is usually twice to ten times.

<Method for Fabricating a Substrate>

The developer of the present invention has an excellent feature which makes it possible to develop a thick photoresist easily with a high degree of accuracy. Therefore, it is suitably used as a developer for fabricating "a substrate on which pattern is formed (fabricated substrate, specifically, microfabricated substrate)" by adopting the development step of thick photoresist. For fabricating semiconductor device, flat-panel display (FPD), circuit substrate, magnetic head, and so on, formation of magnetic pole of the magnetic head and projection electrode (the so-called "bump") to be used as a connecting terminals of large-scale integration (LSI) is carried out by photolithographic method using a thick photoresist. By using the developer of the invention, these connecting terminals can be easily formed with a high degree of accuracy.

When the developer of the invention is applied to the development step in the photolithographic method by use of thick photoresist, resist application step prior to the development step, exposure step, further, etching step and plating step arranged after the development step may be carried out in the same way as those of the conventional photolithographic method. As the photoresist, positive-type photoresist of which exposed area is soluble to the alkaline aqueous solution, and negative-type photoresist of which non-exposed area is soluble to the alkaline aqueous solution are particularly used without limitation.

Examples of the present invention will be described in detail as follows. However, the invention is not limited by the Examples.

EXAMPLE

Examples 1~13 and Comparative Examples 1~6

20.0 mass % of TMAH aqueous solution (Commodity name "SD-20" manufactured by Tokuyama Corporation) was diluted by ultrapure water to prepare 3.0 mass % of TMAH aqueous solution, then specific quantity shown in Table 1~3 (unit: mass %) of each kind of nonionic surfactant and ammonium compound shown in Table 1~3 was added to the obtained aqueous solution so as to prepare various developers.

Next, 4-inch silicon wafers were prepared and these were washed by sulfuric acid-hydrogen peroxide (volume ratio 4:1) and were baked on a hot plate at 200° C. for 60 seconds. Then, by use of spinner, a positive-type photoresist was applied on these silicon wafers to obtain 3.5 µm thick positive-type photoresist films. After that, wavelength 300~500 µm of g-ray, h-ray, i-ray were radiated to these photoresist films through mask patterns, and puddling development in a condition of development time 8 minutes at 23° C. was carried out by use of the various developer to obtain 20 µm of contact hole patterns. Existence of scum and the obtained resist pattern shape were evaluated by SEM (scanning electron microscope) observation. The results are shown in Table 4.

Moreover, 20.0 µm thick positive-type photoresist films were also evaluated in the same way as above. The results are shown in Table 4.

Evaluation of scum was determined in accordance with the following criteria.

○: scum was not caused; and

X: scum was caused.

Also, evaluation of resist pattern shape was determined in accordance with the following criteria.

⊙: very good (error of the pattern's dimension was within the tolerance 5% of the desired dimension);

○: good (error of the pattern's dimension was less than the tolerance 10% of the desired dimension); and X: bad (error of the pattern's dimension was the tolerance 10% or more of the desired dimension).

Table 1

TABLE 1

| | Blended nonionic surfactant | |
|---|---|---|
| | Constitutional formula | Concentration (mass %) |
| Example 1 | $C_{10}H_{21}-O-(CH_2CH_2O)_9-(CH(CH_3)CH_2O)_4-H$ | 1 |
| Example 2 | $C_{10}H_{21}-O-(CH_2CH_2O)_{12}-(CH(CH_3)CH_2O)_{12}-(CH_2CH_2O)_2-H$ | 3 |
| Example 3 | $C_{12}H_{25}-O-(CH_2CH_2O)_6-(CH(CH_3)CH_2O)_7-(CH_2CH_2O)_3-H$ | 5 |
| Example 4 | $C_{12}H_{25}-\overset{O}{\overset{\|}{C}}-O-(CH_2CH_2O)_9-(CH(CH_3)CH_2O)_4-H$ | 5 |
| Example 5 | $C_8H_{17}-O-(CH_2CH_2O)_{12}-(CH(CH_3)CH_2O)_{12}-(CH_2CH_2O)_2-H$ | 7 |
| Example 6 | $HO-(CH_2CH_2O)_{14}-(CH(CH_3)CH_2O)_{30}-(CH_2CH_2O)_{12}-H$ | 3 |
| Example 7 | $C_{12}H_{25}-N\begin{matrix}(CH_2CHO)_3-(CH(CH_3)CH_2O)_5-H\\(CH_2CHO)_5-(CH(CH_3)CH_2O)_6-H\end{matrix}$ | 3 |

TABLE 1-continued

| | Blended ammonium salt | |
|---|---|---|
| | Constitutional formula | Concentration (mass %) |
| Example 1 |  | 0.03 |
| Example 2 |  | 0.05 |
| Example 3 |  | 0.05 |
| Example 4 |  | 0.1 |
| Example 5 |  | 0.3 |
| Example 6 |  | 0.05 |
| Example 7 |  | 0.1 |

TABLE 2

| | Blended nonionic surfactant | |
|---|---|---|
| | Constitutional formula | Concentration (mass %) |
| Example 8 |  | 5 |

TABLE 2-continued

| | Constitutional formula | Concentration (mass %) |
|---|---|---|
| Example 9 | $C_{12}H_{25}-\overset{\overset{O}{\|}}{C}-O-(CH_2CH_2O)_9-(CH(CH_3)CH_2O)_4-H$ | 5 |
| Example 10 | $C_{10}H_{21}-O-(CH_2CH_2O)_9-(CH(CH_3)CH_2O)_4-H$ | 3 |
| Example 11 | $C_{10}H_{21}-O-(CH_2CH_2O)_9-(CH(CH_3)CH_2O)_4-H$ | 3 |
| Example 12 | $\left(\text{Ph}-C_2H_4-\right)_3\text{-(CH}_3\text{)C}_6\text{H}_3\text{-}O-(CH_2CH_2O)_{14}-H$ | 1 |
| Example 13 | $\left(\text{Ph}-C_2H_4-\right)_2\text{-(CH}_3\text{)C}_6\text{H}_3\text{-}O-(CH_2CH_2O)_{10}-CH(CH_3)CH_2OH$ | 1 |

| | Blended ammonium salt | |
|---|---|---|
| | Constitutional formula | Concentration (mass %) |
| Example 8 | $[\text{C}_5\text{H}_5\text{N}-\text{CH}_2-\text{C}_6\text{H}_5]^+ \ \text{Cl}^-$ | 0.1 |
| Example 9 | $[(CH_3)_3N-C_{12}H_{24}-(CH_2CH_2O)_{12}-H]^+ \ OH^-$ | 0.3 |
| Example 10 | $[(CH_3)_3N-CH_2-C_6H_5]^+ \ Cl^-$ | 0.1 |
| Example 11 | $[HO-CH_2CH_2-N(CH_3)_2-C_{12}H_{25}]^+ \ OH^-$ | 0.5 |
| Example 12 | $[(CH_3)_3N-CH_2-C_6H_5]^+ \ OH^-$ | 0.05 |
| Example 13 | $[(CH_3)_3N-CH_2-C_6H_5]^+ \ Cl^-$ | 0.05 |

TABLE 3

| | Blended nonionic surfactant | | Blended ammonium salt | |
|---|---|---|---|---|
| | Constitutional formula | Concentration (mass %) | Constitutional formula | Concentration (mass %) |
| Comparative example 1 | NONE | — | NONE | — |
| Comparative example 2 | $C_{10}H_{21}$—O—$(CH_2CH_2O)_{12}$—$(CH(CH_3)CH_2O)_5$—H | 5 | NONE | — |
| Comparative example 3 | NONE | — | $[C_{10}H_{21}-N(CH_3)_2-CH_2-C_6H_5]^+$ $OH^-$ | 0.1 |
| Comparative example 4 | $C_6H_5$—O—$(CH_2CH_2O)_{10}$—H | 2 | $[C_5H_5N-C_{12}H_{25}]^+$ $Cl^-$ | 0.1 |
| Comparative example 5 | $C_{10}H_{21}$—$C_6H_4$—O—$(CH_2CH_2O)_{10}$—H | 2 | $[C_5H_5N-C_{12}H_{25}]^+$ $Cl^-$ | 0.1 |
| Comparative example 6 | $C_{10}H_{21}$—O—$(CH_2CH_2O)_9$—$(CH(CH_3)CH_2O)_4$—H | 0.1 | $[(CH_3)_3N-CH_2-C_6H_5]^+$ $Cl^-$ | 0.005 |

TABLE 4

| | Results (3.5 μm) | | Results (20 μm) | |
|---|---|---|---|---|
| | scum | pattern | scum | pattern |
| Example 1 | ○ | ○ | ○ | ○ |
| Example 2 | ○ | ⊚ | ○ | ⊚ |
| Example 3 | ○ | ⊚ | ○ | ⊚ |
| Example 4 | ○ | ⊚ | ○ | ⊚ |
| Example 5 | ○ | ⊚ | ○ | ⊚ |
| Example 6 | ○ | ⊚ | ○ | ⊚ |
| Example 7 | ○ | ○ | ○ | ○ |
| Example 8 | ○ | ○ | ○ | ○ |
| Example 9 | ○ | ○ | ○ | ○ |
| Example 10 | ○ | ⊚ | ○ | ⊚ |
| Example 11 | ○ | ○ | ○ | ○ |
| Example 12 | ○ | ⊚ | ○ | ⊚ |
| Example 13 | ○ | ⊚ | ○ | ⊚ |
| Comparative Example 1 | X | X | X | X |
| Comparative Example 2 | X | X | X | X |
| Comparative Example 3 | X | X | X | X |
| Comparative Example 4 | X | X | X | X |
| Comparative Example 5 | X | X | X | X |
| Comparative Example 6 | X | X | X | X |

As shown in Table 4, Examples 1~13 of the present invention did not cause scum and the obtained pattern shapes thereof were favorable. Especially, Examples 2~6, 10, 12, and 13 of the pattern shapes were excellent.

Figure 1A:
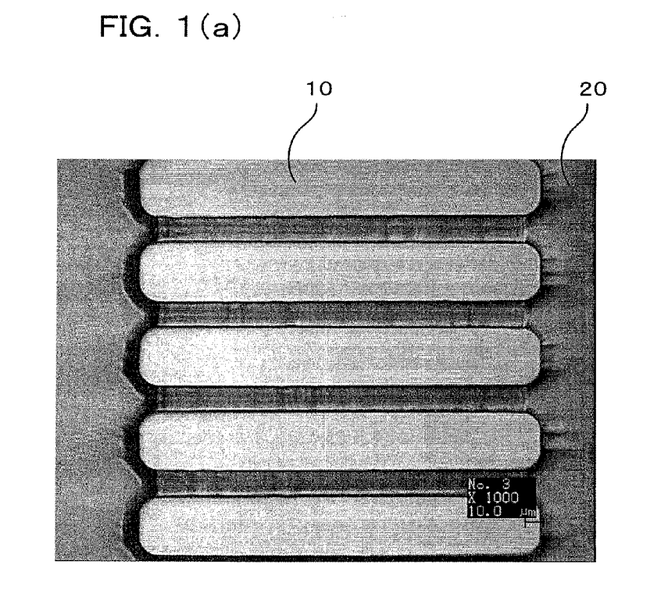
Figure 1B:
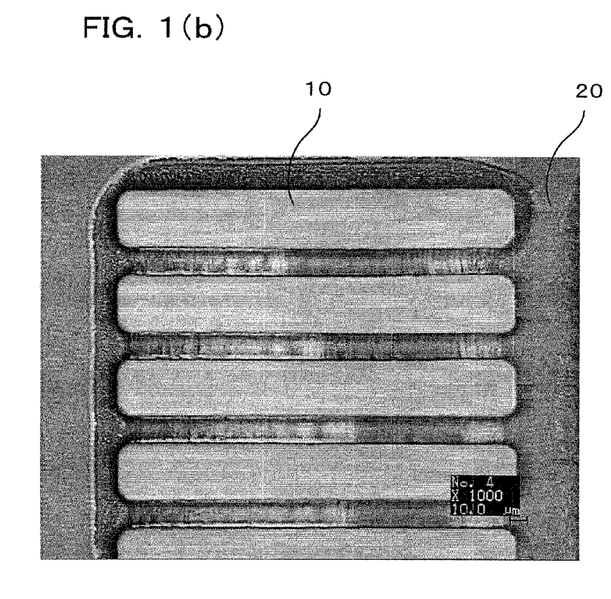

FIGS. 1(a) and 1(b) show conditions of the resist dissolution part 10 and the resist pattern part 20 in a circumstance where the substrate on which 20 μm thick positive-type photoresist film was formed was developed by use of the developer of Example 11. FIG. 1(a) shows a condition after 8 minutes development, and FIG. 1(b) shows a condition after 12 minutes development.

Figure 2A:
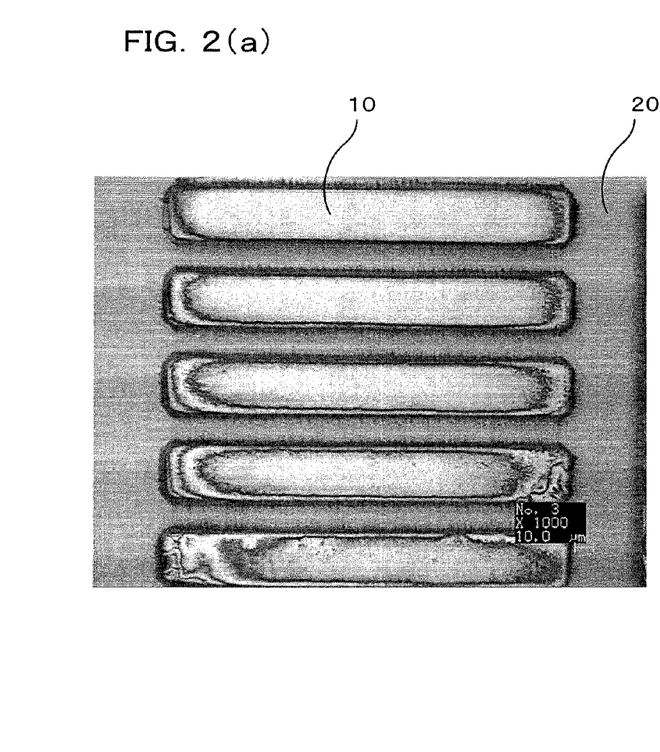
Figure 2B:
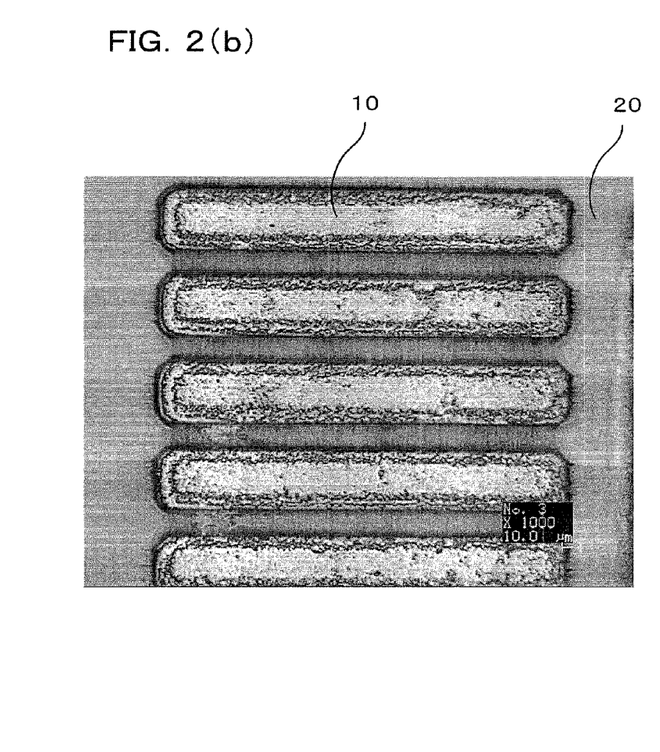

FIGS. 2(a) and 2(b) show conditions of the resist dissolution part 10 and the resist pattern part 20 in a circumstance where the substrate on which 20 μm thick positive-type photoresist film was formed was developed by use of the developer of the comparative example 6. FIG. 2(a) shows a condition after 6 minutes development, and FIG. 2(b) shows a condition after 8 minutes development.

As shown in FIGS. 1(a) and 1(b), when the developer of Example 11 was used, generation of scum could be inhibited, and favorable resist pattern shape could be obtained. On the other hand, as shown in FIGS. 2(a) and 2(b), when the developer of the comparative example 6 was used, after 6 minutes development, scum was caused in the resist dissolution part 10 (FIG. 2(a)). Further, after 8 minutes development, large amount of scum was caused in the resist dissolution part 10 (FIG. 2(b)).

The invention claimed is:

1. A positive photoresist developer comprising a basic aqueous solution containing a nonionic surfactant and an ammonium compound, wherein said nonionic surfactant has one or more kinds of alkyleneoxide group repeating structure in which 11~70 units of said alkyleneoxide group are included and content of said nonionic surfactant is 0.5~10 mass % to total mass of said photoresist developer as 100 mass %;

said ammonium compound is represented by a following general formula (1):

(1)

[In the formula (1), $R^1$ is a hydrocarbon group represented by —$CH_2$—Ar, wherein Ar is an aromatic hydrocarbon group of carbon number 6-10; each of $R^2$, $R^3$, and $R^4$ is independently an organic group of carbon number 1 to 5, or two or three thereof are bonded each other to form a heterocycle of carbon number 4~20; and X is OH, Cl, Br, or I.]

and content of said ammonium compound is 0.01~5.0 mass % to total mass of said photoresist developer as 100 mass %; and a basic compound to make said basic aqueous solution basic is represented by a following general formula (3):

(3)

[In the formula (3), each of $R^{11}$, $R^{12}$, $R^{13}$, and $R^{14}$ is independently a hydrogen atom or an organic group of carbon number 1-3]; and said nonionic surfactant is represented by a following general formula (2):

$R^5$—Z—{(YO)$_b$—$R^6$}$_a$ (2)

[In the formula (2), a is an integer of 1 or 2; each of $R^5$ and $R^6$ is a hydrogen atom or an organic group of carbon number 1-40; Z is an (a+1) valent heteroatom; and (YO)$_b$ is represented by a following general formula (2-1) or (2-2):

—(CH$_2$CH$_2$O)$_l$—(CH(CH$_3$)CH$_2$O)$_m$—(CH$_2$CH$_2$O)$_n$— (2-1)

—(CH(CH$_3$)CH$_2$)$_l$—(CH$_2$CH$_2$O)$_m$—(CH(CH$_3$)CH$_2$O)$_n$— (2-2)

wherein l and m are each independently an integer of 3-40; n is an integer of 1-30; where a is 1, l+m+n is 11-70; where a is 2, l+m+n is 6-35; and where a is 2, two {(YO)$_b$— $R^6$} may be the same or different from each other.].

2. The photoresist developer according to claim 1, wherein $R^5$ in the general formula (2) is a hydrocarbon group containing at least two benzene rings.

3. The photoresist developer according to claim 1, wherein said developer is used for developing a 3 μm~100 μm thick exposed positive photoresist layer.

4. The photoresist developer according to claim 1, wherein content of said basic compound is 0.1~10 mass % to total mass of said photoresist developer as 100 mass %.

5. The photoresist developer according to claim 1, wherein content of said nonionic surfactant is 1~7 mass % to total mass of said photoresist developer as 100 mass %.

6. The photoresist developer according to claim 1, wherein content of said ammonium compound is 0.03~1.0 mass % to total mass of said photoresist developer as 100 mass %.

7. The photoresist developer according to claim 2, wherein $R^5$ in the general formula (2) is a hydrocarbon group of carbon number 14~29 represented by a following general formula (6):

(6)

[In the formula (6), $R^9$ is a hydrogen atom or a methyl group; $R^{10}$ is an alkylene group of carbon number 1~3; p is an integer 1~3.].

8. The photoresist developer according to claim 7, wherein $R^{10}$ in the general formula (6) is selected from a group consisting of methylene group, ethylene group, and trimethylene group.

9. The positive photoresist developer according to claim 1, wherein in the formula (1) each of $R^2$, $R^3$, and $R^4$ is independently an organic group of carbon number 1 to 5.

10. A positive photoresist developer comprising a basic aqueous solution containing a nonionic surfactant and two or more kinds of ammonium cations, wherein said photoresist developer is obtained by dissolving in water said nonionic surfactant having one or more kinds of alkyleneoxide group repeating structure, in which 11~70 units of said alkyleneoxide group are included, at the amount of 0.5~10 mass % to total mass of said photoresist developer as 100 mass %, one of said ammonium compounds represented by a following general formula (1):

(1)

[In the formula (1), $R^1$ is a hydrocarbon group represented by —$CH_2$—Ar, wherein Ar is an aromatic hydrocarbon group of carbon number 6-10; each of $R^2$, $R^3$, and $R^4$ is independently an organic group of carbon number 1 to 5, or two or three thereof are bonded each other to form a heterocycle of carbon number 4-20; and X is OH, Cl, Br, or I.]

at the amount of 0.01-5.0 mass % to total mass of said photoresist developer as 100 mass %; and another ammonium compound represented by a following general formula (3):

(3)

[In the formula (3), each of $R^{11}$, $R^{12}$, $R^{13}$, and $R^{14}$ is independently a hydrogen atom or an organic group of carbon number 1·3.]

at the amount of 0.1~10 mass % to total mass of said photoresist developer as 100 mass %,
and wherein said nonionic surfactant is represented b a following general formula (2):

$$R^5-Z-\{(YO)_B-R^6\}_a \quad (2)$$

[In the formula (2), a is an integer of 1 or 2; each of $R^5$ and $R^6$ is a hydrogen atom or an organic group of carbon number 1-40; Z is an (a+1) valent heteroatom; and $(YO)^b$ is represented by a following general formula (2-1) or (2-2):

$$-(CH_2CH_2O)_l-(CH(CH_3)CH_2O)_m-(CH_2CH_2O)_n- \quad (2\text{-}1)$$

$$-(CH(CH_3)CH_2)_l-(CH_2CH_2O)_m-(CH(CH_3)CH_2O)_n- \quad (2\text{-}2)$$

wherein l and m are each independently an integer of 3-40; n is an integer of 1-30;
where a is 1, l+m+n is 11-70; where a is 2, l+m+n is 6-35; and where a is 2, two $\{(YO)_b-R^6\}$ may be the same or different from each other.].

* * * * *